(12) United States Patent
Ma et al.

(10) Patent No.: US 11,070,316 B2
(45) Date of Patent: *Jul. 20, 2021

(54) INFORMATION PROCESSING METHOD, APPARATUS, COMMUNICATIONS DEVICE, AND COMMUNICATIONS SYSTEM

(71) Applicant: Huawei Technologies Co., Ltd., Shenzhen (CN)

(72) Inventors: Liang Ma, Shanghai (CN); Xin Zeng, Shenzhen (CN); Chen Zheng, Shanghai (CN); Xiaojian Liu, Shenzhen (CN); Yuejun Wei, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 4 days.

This patent is subject to a terminal disclaimer.

(21) Appl. No.: 16/563,545

(22) Filed: Sep. 6, 2019

(65) Prior Publication Data

US 2019/0393985 A1 Dec. 26, 2019

Related U.S. Application Data

(63) Continuation of application No. 16/234,138, filed on Dec. 27, 2018, now Pat. No. 10,425,191, which is a (Continued)

(30) Foreign Application Priority Data

Jun. 19, 2017 (CN) .......................... 201710465748.2
Aug. 21, 2017 (CN) .......................... 201710719562.5

(51) Int. Cl.
*H03M 13/00* (2006.01)
*H04L 1/00* (2006.01)
(Continued)

(52) U.S. Cl.
CPC ....... *H04L 1/0067* (2013.01); *H03M 13/1102* (2013.01); *H03M 13/116* (2013.01); (Continued)

(58) Field of Classification Search
CPC ............ H04L 1/0067; H03M 13/1102; H03M 13/116; H03M 13/1185; H03M 13/616; H03M 13/618
See application file for complete search history.

(56) References Cited

U.S. PATENT DOCUMENTS 6,405,338 B1 6/2002 Sinha et al.
6,658,381 B1 12/2003 Hellwig et al.
(Continued)

FOREIGN PATENT DOCUMENTS

CN 101060338 A 10/2007
CN 101188428 A 5/2008
(Continued)

OTHER PUBLICATIONS

Gallager, "Low-Density Parity-Check Codes," IRE Transactions on Information Theory, pp. 21-28 (Jan. 1962).
(Continued)

*Primary Examiner* — Esaw T Abraham
(74) *Attorney, Agent, or Firm* — Leydig, Voit & Mayer, Ltd.

(57) ABSTRACT

An information processing method, an apparatus, a communications device, and a communications system are provided. The communications device is configured to: obtain a starting position in a buffer sequence W for an output bit sequence, and determine the output bit sequence from the buffer sequence W based on the starting position, where a value of the starting position is one element in $\{p_0, p_1, p_2, \ldots, p_{k_{max}-1}\}$, $0 \leq k < k_{max}$, $0 \leq p_k < N_{CB}$, $p_k$ is an integer, k is an integer, $N_{CB}$ is a length of the buffer sequence W, $k_{max}$ is (Continued)

an integer greater than or equal to 4, and there are two or more different neighboring intervals in $\{p_0, p_1, p_2, \ldots, p_{k_{max}-1}\}$. A bit sequence for initial transmission or retransmission is properly determined, so that decoding performance of a communications device on a receive end after receiving the bit sequence is improved, a decoding success rate is enhanced, and a quantity of retransmission times is further reduced.

21 Claims, 9 Drawing Sheets

Related U.S. Application Data continuation of application No. PCT/CN2018/079909, filed on Mar. 21, 2018.

(51) Int. Cl.
  *H04L 1/18* (2006.01)
  *H03M 13/11* (2006.01)

(52) U.S. Cl.
  CPC ..... *H03M 13/1185* (2013.01); *H03M 13/616* (2013.01); *H03M 13/618* (2013.01); *H03M 13/635* (2013.01); *H03M 13/6306* (2013.01); *H03M 13/6362* (2013.01); *H04L 1/0045* (2013.01); *H04L 1/0057* (2013.01); *H04L 1/0068* (2013.01); *H04L 1/18* (2013.01); *H04L 1/1812* (2013.01); *H04L 1/1819* (2013.01)

(56) References Cited

U.S. PATENT DOCUMENTS

| | | | |
|---|---|---|---|
| 7,000,174 B2 | 2/2006 | Mantha et al. | |
| 7,734,983 B2 | 6/2010 | Li | |
| 7,831,895 B2 | 11/2010 | Lin | |
| 7,890,834 B2* | 2/2011 | Blankenship | H04L 1/1819 714/755 |
| 7,924,763 B2* | 4/2011 | Nimbalker | H04L 1/0069 370/315 |
| 8,140,950 B2 | 3/2012 | Mantha et al. | |
| 8,423,876 B2 | 4/2013 | Okamura et al. | |
| 8,516,334 B2 | 8/2013 | Xu et al. | |
| 8,520,496 B2* | 8/2013 | Nimbalker | H04L 1/0071 370/206 |
| 8,532,220 B2 | 9/2013 | Lu et al. | |
| 8,539,304 B1* | 9/2013 | Shirali | H03M 13/1185 714/758 |
| 8,560,910 B2* | 10/2013 | Takaoka | H04L 1/1819 714/752 |
| 8,780,930 B2* | 7/2014 | Cheng | H04L 1/0067 370/412 |
| 8,812,930 B1* | 8/2014 | Shirali | H03M 13/6561 714/758 |
| 8,819,528 B2 | 8/2014 | Murakami et al. | |
| 8,854,237 B2 | 10/2014 | Cideciyan et al. | |
| 8,868,988 B2* | 10/2014 | Sun | H04L 1/1819 714/701 |
| 9,602,142 B2 | 3/2017 | Murakami et al. | |
| 2007/0162814 A1 | 7/2007 | Shen et al. | |
| 2010/0050044 A1 | 2/2010 | Kuri et al. | |
| 2012/0272113 A1 | 10/2012 | Levita | |
| 2015/0071374 A1 | 3/2015 | Oh et al. | |
| 2019/0356333 A1 | 11/2019 | Ma et al. | |

FOREIGN PATENT DOCUMENTS

| | | |
|---|---|---|
| CN | 101227259 A | 7/2008 |
| CN | 101453463 A | 6/2009 |
| CN | 101682486 A | 3/2010 |
| CN | 103312442 A | 9/2013 |
| CN | 108400844 A | 8/2018 |
| EP | 3570475 A1 | 11/2019 |
| JP | 2020511030 A | 4/2020 |
| WO | 2018141240 A1 | 8/2018 |
| WO | 2018144560 A1 | 8/2018 |

OTHER PUBLICATIONS

"3rd Generation Partnership Project; Technical Specification Group Radio Access Network; NR; Multiplexing and channel coding (Release 15)," 3GPP TS 38.212 V0.0.0, pp. 1-10, 3rd Generation Partnership Project, Valbonne, France (May 2017).

"LDPC HARQ design," 3GPP TSG RAN WG1 Ad hoc, Spokane, USA, R1-1700384, XP051207921, pp. 1-2, 3rd Generation Partnership Project, Valbonne, France (Jan. 16-20, 2017).

"Non-uniform RV positions for LDPC," 3GPP TSG RAN WG1 Meeting NR #3, Nagoya, Japan, R1-1716734, XP051353873, pp. 1-5, 3rd Generation Partnership Project, Valbonne, France (Sep. 18-21, 2017).

"Finalization of remaining details of rate-matching," 3GPP TSG RAN WG1 Meeting NR #3, Nagoya, Japan, R1-1716329, XP051329920, 3rd Generation Partnership Project, Valbonne, France (Sep. 18-21, 2017).

CN/201710719562.5, Office Action/Search Report, dated Feb. 20, 2021.

U.S. Appl. No. 16/234,138, filed Dec. 27, 2018.

* cited by examiner

FIG. 1

INFORMATION PROCESSING METHOD, APPARATUS, COMMUNICATIONS DEVICE, AND COMMUNICATIONS SYSTEM

CROSS-REFERENCE TO RELATED APPLICATIONS

This application is a continuation of U.S. patent application Ser. No. 16/234,138, filed on Dec. 27, 2018, which is now U.S. patent Ser. No. 10/425,191, issued Sep. 24, 2019, and is a continuation of International Application No. PCT/CN2018/079909, filed on Mar. 21, 2018. The International Application claims priority to Chinese Patent Application No. 201710719562.5, filed on Aug. 21, 2017, and Chinese Patent Application No. 201710465748.2, filed on Jun. 19, 2017. The disclosures of all of the aforementioned patent applications are hereby incorporated by reference in their entireties.

TECHNICAL FIELD

Embodiments of the present invention relate to the communications field, and in particular, to an information processing method, an apparatus, a communications device, and a communications system.

BACKGROUND

In a wireless communications system, a hybrid automatic repeat request (HARQ) technology is an important technology which can improve data link reliability.

Low-density parity-check (LDPC) code is a type of linear block code that has a sparse parity-check matrix and is featured by a flexible structure and low decoding complexity. Due to use of an iteration decoding algorithm of partial parallelism, the LDPC code has a higher throughput rate than conventional Turbo code. The LDPC code is considered as next-generation error correcting code for a communications system and can be used to improve reliability and power utilization of channel transmission, and can be widely applied to space communication, fiber optic communications, a personal communications system, an asymmetric digital subscriber line (ADSL), a magnetic recording device, and the like. Currently, in the 5$^{th}$ generation (5G) mobile communication, the LDPC code has been considered to be used as one of channel coding schemes.

To support different code lengths and code rates, a communications device performs rate matching after channel coding to adjust a code rate of a coded block, and obtains a bit sequence that needs to be sent, to match a decoding code rate. The communications device may further perform bit puncturing on an LDPC coded block during rate matching, to increase the code rate; or the communications device performs bit repetition on an LDPC coded block during rate matching, to decrease the code rate.

During the rate matching, the communications device on a transmit end selects a bit sequence that needs to be sent, and sends the bit sequence to a communications device on a receive end after performing processes such as interleaving and mapping etc. The communications device on the receive end combines soft values of the bit sequence with stored soft value bits (soft channel bit) and performs decoding, to obtain the code block.

In the prior art, when using an existing rate matching method, the communications device has poor HARQ performance.

SUMMARY

Embodiments of the present invention provide an information processing method, an apparatus, a communications device, and a communications system, to improve HARQ performance.

According to a first aspect, an information processing method for a communications system is provided. The method includes: obtaining a starting position $k_0$ in a buffer sequence W for an output bit sequence, where the buffer sequence W includes a bit sequence D or a part of a bit sequence D, and a length of the bit sequence D is $K_D$ bits; and determining the output bit sequence from the buffer sequence W based on the starting position $k_0$.

According to a second aspect, an information processing method for a communications system is provided. The method includes: obtaining a starting position $k_0$ in a buffer sequence W for a soft bit sequence, where the buffer sequence W includes a soft value sequence of a bit sequence D or a part of a soft value sequence of a bit sequence D, and a length of the soft value sequence of the bit sequence D is $K_D$; and combining and storing the soft bit sequence with the buffer sequence W starting from the starting position $k_0$.

In a possible implementation of the first aspect or the second aspect, a value of $k_0$ is $p_k$, $p_k$ is one element of $\{p_0, p_1, p_2, \ldots, p_{k_{max}-1}\}$, $0 \leq k \leq k_{max}$, $0 \leq p_k < N_{CB}$, $p_k$ is an integer, k is an integer, $N_{CB}$ is a length of the buffer sequence W, and $k_{max}$ is an integer greater than or equal to 4; and there are two or more different intervals between adjacent values in $\{p_0, p_1, p_2, \ldots, p_{k_{max}-1}\}$.

In the foregoing implementation, a length of the soft value sequence of the bit sequence D is $K_D$, and the bit sequence D is a bit sequence that is obtained by encoding a bit sequence C with a length K based on a low-density parity-check (LDPC) matrix, or the bit sequence D is obtained by shortening, by $s_0$ bits, a bit sequence that is obtained by encoding a bit sequence C with a length K based on a low-density parity-check (LDPC) matrix.

Based on the output bit sequence determined in the foregoing implementation, a quantity of repeated bits is reduced, thereby reducing loss of decoding performance.

In another possible implementation of the first aspect or the second aspect, if k=0, $p_0$=0 or $p_0$=$l_0 \cdot r$, where $l_0$ is a positive integer, r is a quantity of bits included in a unit bit segment in the buffer sequence W, and r is an integer greater than 0.

For example, $k_{max}=2^n$, and n is an integer greater than or equal to 2.

In another possible implementation based on any one of the first aspect or the second aspect or the foregoing implementation, $k_{max}=4$, and if $N_{CB} \geq K_D$ and k>0, $p_k \geq (p_0+K)$ or $p_k \geq (p_0-s_0+K)$; and
 if $N_{CB} < K_D$ and k>0, $$p_k \geq \left(p_0 + \left\lceil K \cdot \frac{N_{CB}}{K_D}\right\rceil\right) \text{ or } p_k \geq \left(p_0 + \left\lfloor K \cdot \frac{N_{CB}}{K_D}\right\rfloor\right), \text{ or}$$

$$p_k \geq \left(p_0 - s_0 + \left\lceil K \cdot \frac{N_{CB}}{K_D}\right\rceil\right) \text{ or } p_k \geq \left(p_0 - s_0 + \left\lfloor K \cdot \frac{N_{CB}}{K_D}\right\rfloor\right),$$

⌈ ⌉ represents rounding up and ⌊ ⌋ represents rounding down.

Optionally, if $p_0 < p_1 < p_2 < p_3$, $(p_1 - p_0) > (p_2 - p_1)$.

In addition, to make the starting position be an integral multiple of the unit bit segment, $p_k = l_k \cdot r$ and $l_k$ is a positive integer.

Optionally, a quantity of shortened bits is $s_0 = n \cdot r$, and n is a positive integer.

In a possible design, r=z and z is a lifting factor of the LDPC matrix.

In another possible design, if a row quantity of an interleaving matrix is $R_{subblock}$, r may be $R_{subblock}$.

In still another possible implementation based on any one of the foregoing implementations, the starting position $k_0$ is determined based on a starting position number of a redundancy version $rv_{idx}$.

In a possible design, the starting position $k_0$ may be obtained based on a parameter of a starting position number of a redundancy version $rv_{idx}$.

For example, in adaptive retransmission, the starting position number of the redundancy version $rv_{idx}$ may be obtained from signaling.

For another example, in adaptive retransmission or non-adaptive retransmission, the starting position number of the redundancy version $rv_{idx}$ may be obtained based on a sequence of starting position numbers of redundancy versions and i, i is a quantity of transmission times.

The sequence of starting position numbers of redundancy versions is read from a memory, or the sequence of starting position numbers of redundancy versions is determined based on a code rate of initial transmission, or the sequence of starting position numbers of redundancy versions is determined based on a length of the output bit sequence and the lifting factor z.

According to a third aspect, a communications apparatus is provided, and the communications apparatus may include a corresponding module configured to perform any possible implementation of the first aspect in the foregoing method design. The module may be software and/or hardware.

In a possible design, the communications apparatus provided in the third aspect includes an obtaining unit, configured to obtain a starting position $k_0$ in a buffer sequence W for an output bit sequence, and a determining unit, configured to determine the output bit sequence from the buffer sequence W based on the starting position $k_0$.

The apparatus may be configured to perform the method described in any possible implementation of the first aspect. For details, refer to the description of the foregoing aspect.

In a possible design, the obtaining unit and the determining unit may be one or more processors.

Optionally, the communications apparatus further includes a transceiver unit, and the transceiver unit is configured to input/output a signal, for example, configured to output a signal corresponding to the output bit sequence.

The transceiver unit may be a transceiver, or may be an input/output circuit or a communications interface. For example, the communications apparatus may be a terminal or a base station or a network device, and the transceiver unit of the communications apparatus may be a transceiver. The communications apparatus may alternatively be a chip, and a transceiver component of the communications apparatus may be an input/output circuit of the chip.

According to a fourth aspect, a communications apparatus is provided, and the communications apparatus may include a corresponding module configured to perform any possible implementation of the second aspect in the foregoing method design. The module may be software and/or hardware.

In a possible design, the communications apparatus provided in the fourth aspect includes an obtaining unit, configured to obtain a starting position $k_0$ in a buffer sequence W for a soft bit sequence, and a processing unit, configured to combine and store the soft bit sequence in the buffer sequence W starting from the starting position $k_0$.

The apparatus may be configured to perform the method described in any possible implementation of the second aspect. For details, refer to the description of the foregoing aspect.

In a possible design, the obtaining unit and the processing unit may be one or more processors.

Optionally, the communications apparatus may further include a transceiver unit, and the transceiver unit is configured to input/output a signal, for example, configured to receive a signal including the soft bit sequence.

The transceiver unit may be a transceiver, or may be an input/output circuit or a communications interface. For example, the communications apparatus may be a terminal or a base station or a network device, and the transceiver unit of the communications apparatus may be a transceiver. The communications apparatus may alternatively be a chip, and a transceiver component of the communications apparatus may be an input/output circuit of the chip.

According to a fifth aspect, a communications apparatus is provided, and communications apparatus includes one or more processors.

In a possible design, the one or more processors may implement functions of the first aspect and any implementation of the first aspect. Optionally, in addition to implementing the functions of the first aspect and any implementation of the first aspect, the processor may further implement another function.

In a possible design, the one or more processors may implement functions of the second aspect and any implementation of the second aspect. Optionally, in addition to implementing the functions of the second aspect and any implementation of the second aspect, the processor may further implement another function.

Optionally, the communications apparatus provided in the fifth aspect may further include a transceiver and an antenna.

Optionally, the communications apparatuses provided in the third to the fifth aspects may further include a component configured to generate a transmission block CRC, a component used for code block segmentation and CRC check, an encoder, an interleaver used for interleaving, a modulator used for modulation processing, or the like. In a possible design, the one or more processors may be used to implement functions of the components.

Optionally, the communications apparatuses provided in the third to the fifth aspects may further include a demodulator used for a demodulation operation, a de-interleaver used for de-interleaving, a decoder, or the like. In a possible design, the one or more processors may be used to implement functions of the components.

According to a sixth aspect, an embodiment of the present invention provides a communications system. The system includes the communications apparatus according to any one of the third to the fifth aspects.

According to still another aspect, an embodiment of the present invention provides a computer storage medium, where the computer storage medium stores a program, and when the program is run, a computer performs the method according to the foregoing aspects.

Another aspect of this application provides a computer program product including an instruction, and when the computer program product is run on a computer, the computer performs the method according to the foregoing aspects.

Based on the information processing method, the apparatus, the communications device, and the communications system provided in the embodiments of the present invention, HARQ performance can be improved.

BRIEF DESCRIPTION OF DRAWINGS

FIG. 1 is a schematic diagram of a base matrix of Low-density parity-check (LDPC) code and circular permutation matrices of the base matrix of the LDPC code;

FIG. 4-1 is a schematic diagram of a coded block according to an embodiment of the present invention;

FIG. 4-2 is a schematic diagram of a possible starting position setting method and a retransmission method;

FIG. 4-3 is a schematic diagram of another possible starting position setting method and a retransmission method;

FIG. 4-4 is a schematic diagram of starting position setting according to an embodiment of the present invention;

FIG. 5-1 is a base graph of LDPC code according to an embodiment of the present invention;

FIG. 5-2 is a performance simulation diagram based on FIG. 5-1;

FIG. 5-3 is a performance simulation diagram based on FIG. 5-1;

FIG. 5-4 is a performance simulation diagram based on FIG. 5-1;

DESCRIPTION OF EMBODIMENTS

Figure 2:
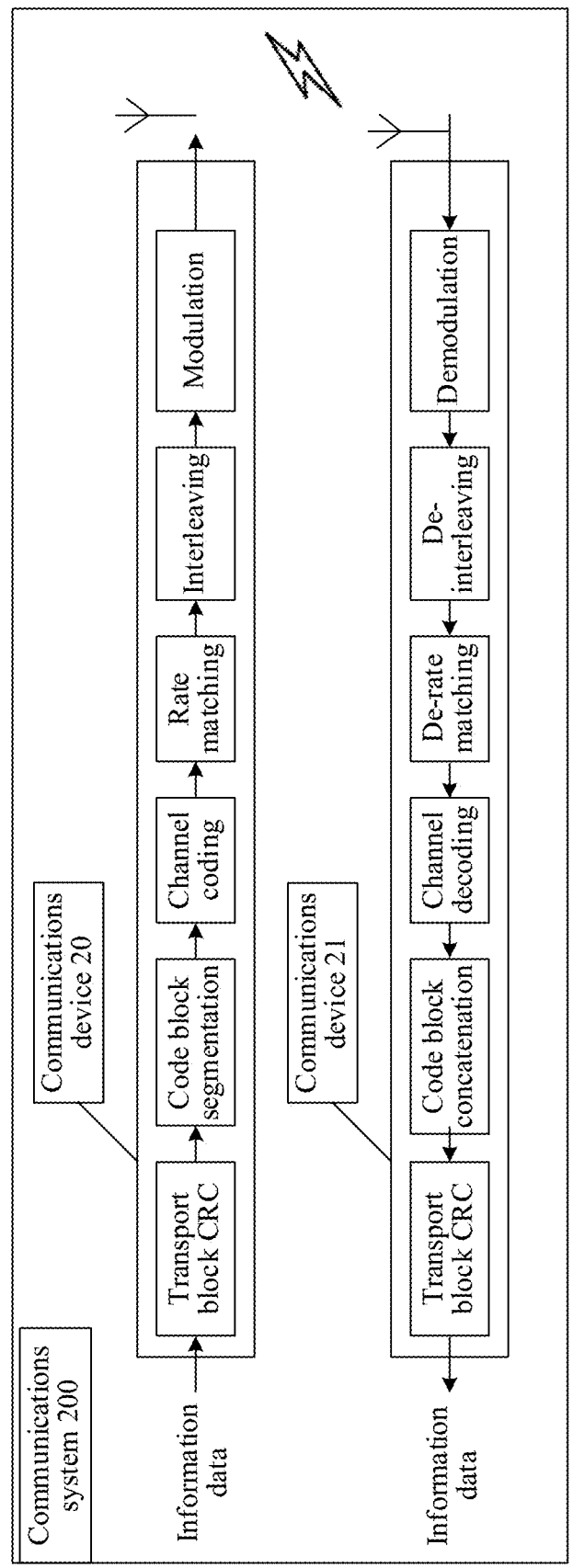
FIG. 2 is a structural diagram of a communications system according to an embodiment of the present invention.

For ease of understanding, some nouns used in this application are described below.

In this application, nouns "network" and "system" are usually alternately used and "apparatus" and "device" are usually alternately used, and persons skilled in the art can understand meanings of the nouns. A "communications apparatus" may be a chip (for example, a baseband chip, a digital signal processing chip, or a general-purpose chip), a terminal, a base station, or another network device. The terminal is a device with a communication function, and may include a handheld device, an in-vehicle device, a wearable device, a computing device, another processing device connected to a wireless modem, or the like that has a wireless communication function. The terminal may be deployed on land including indoor or outdoor land, and the terminal may be a handheld terminal or an in-vehicle terminal. The terminal may alternatively be deployed on a water surface (for example, on a ship). The terminal may alternatively be deployed in the air (for example, on an airplane, a balloon, and a satellite). The terminal device may be a mobile phone, a tablet computer (e.g., Pad), a computer with a wireless sending and receiving function, a virtual reality (VR) terminal device, an augmented reality (AR) terminal device, a wireless terminal related to industrial control, a wireless terminal related to self-driving, a wireless terminal related to remote medical, a wireless terminal related to a smart grid, a wireless terminal related to transportation safety, a wireless terminal related to a smart city, a wireless terminal related to a smart home, or the like. In different networks, the terminal may have different names, for example, user equipment, a mobile station, a subscriber unit, a station, a cellular phone, a personal digital assistant, a wireless modem, a wireless communications device, a handheld device, a laptop computer, a cordless phone, and a wireless local loop board. For ease of description, the terminal device is referred to as a terminal for short in this application. The base station (BS) may also be referred to as a base station device, and is a device that is deployed in a radio access network and used to provide a wireless communication function. In different radio access systems, the base station may have different names. For example, in a Universal Mobile Telecommunications System (UMTS) network, the base station is referred to as a NodeB; in an LTE network, the base station is referred to as an evolved NodeB (eNB or eNodeB); or in a new radio (NR) network, the base station is referred to as a transmission reception point (TRP) or a next-generation NodeB (gNB). Alternatively, in another network in which a plurality of technologies are integrated or in other various evolved networks, the base station may have other names. The present invention is not limited thereto.

The technical solutions in the embodiments of the present invention are described below with reference to the accompanying drawings in the embodiments of the present invention.

Low-density parity-check (LDPC) code may usually be represented by using a parity check matrix H. The parity check matrix H of the LDPC code may be obtained by using a base graph and a shift value. The base graph may usually include m*n matrix elements (entry), and may be represented by a matrix of m rows and n columns. Symbol * means multiply hereinafter. Value of each matrix element in the base graph is either 0 or 1. An element in the base graph whose value is 0 is sometimes referred to as a zero-element, which may be replaced with an all-zero matrix (zero matrix) of size z*z. An element in the base graph whose value is 1 is sometimes referred to as a non-zero-element, which may be replaced with a circular permutation matrix of size z*z. That is, each matrix element in the base graph represents an all-zero matrix or a circular permutation matrix. It should be noted that in this specification, row indexes and column indexes of the base graphs and the matrices are numbered starting from 0, but this is merely for ease of understanding. It may be understood that the row indexes and the column indexes may alternatively be numbered starting from 1, and corresponding row indexes and column indexes are increased by 1 based on the row indexes and the column indexes shown in this specification.

If a value of an element in row i and column j (i and j are respectively row and column indexes as defined above, i.e. starting from 0) in the base graph is 1 and a shift value of the element is $P_{i,j}$, where $P_{i,j}$ is an integer greater than or equal to 0, it indicates that the element in the row i and the column j whose value is 1 may be replaced by a z*z circular permutation matrix corresponding to $P_{i,j}$. The circular permutation matrix may be obtained by circularly shifting an identity matrix of size z*z to right for $P_{i,j}$ times. In constructing a parity-check matrix H of the LDPC code, each element whose value is 0 in the base graph is replaced by an all-zero matrix of size z*z, and each element whose value is 1 in the base graph is replaced by a circular permutation matrix of size z*z corresponding to a shift value of the element. z is a positive integer and may be referred to as a lifting factor, and may be determined based on a code block size supported by a system and an information data size. It may be learned that a size of the parity check matrix H is $(m*z)*(n*z)$.

$P_{i,j}$ may be obtained based on the lifting factor z. For an element in the base graph whose value is 1, $P_{i,j}$ may be different for different lifting factors z. To simplify implementation, usually, an m*n base matrix may be defined in the system, and a position of each element in the base matrix corresponds one-to-one to a position of each element in the base graph. A zero-element in the base graph has a same position in the base matrix and the zero-element is represented by −1 in the base matrix. A non-zero-element whose value is 1 in the row i and the column j in the base graph has a same position in the base matrix and the non-zero-element may be represented by $P_{i,j}$ in the base matrix, and $P_{i,j}$ is a positive integer greater than or equal to 0. In this embodiment of this application, the base matrix is sometimes referred to as a shift matrix of a base graph.

Figures 1, 4:
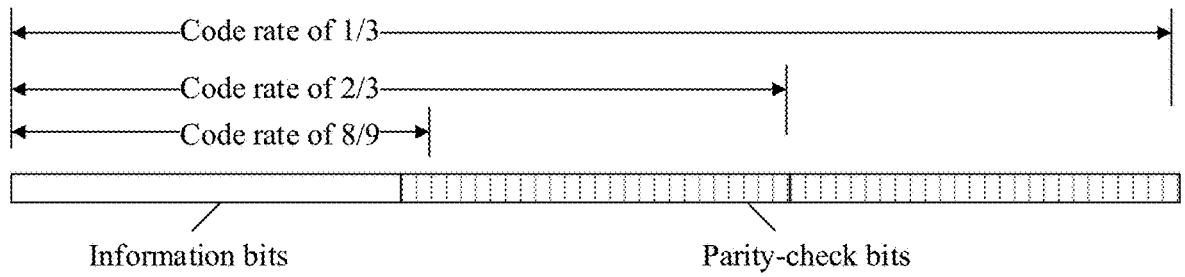
Figures 2, 4:
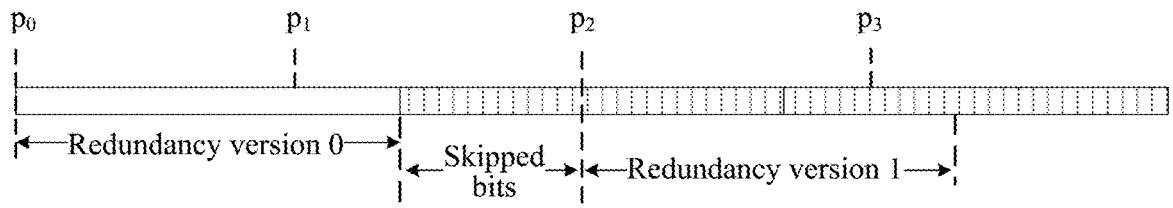
Figures 3, 4:
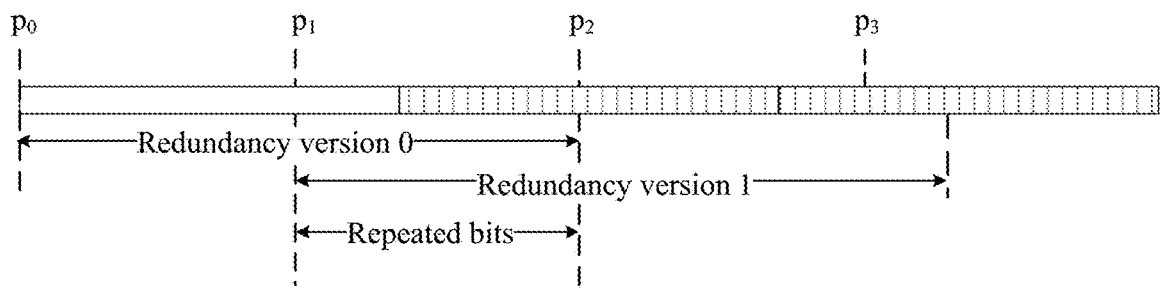

FIG. 1 is a schematic diagram of a base matrix of LDPC code in a communications system and circular permutation matrices when a lifting factor is 4. The base matrix of the LDPC code has m*n elements. FIG. 1 shows a base matrix of LDPC code in a quasi cyclic (QC) structure in which m=13 and n=38, and a code rate of the LDPC code is (n−m)/n=0.6579. If a lifting factor z=4, all elements whose value is −1 in the matrix are 4*4 zero matrices after lifting, and other elements are 4*4 circular permutation matrices after the lifting. The circular permutation matrix may be obtained by performing cyclic shift on an identity matrix I for a corresponding quantity of times, and the quantity of shift times is equal to a value of a corresponding matrix element. As shown in FIG. 1, a corresponding circular permutation matrix of an element whose value is 0 in the base matrix after lifting is a 4*4 identity matrix I, and a corresponding circular permutation matrix of an element whose value is 1 after lifting is a matrix that is obtained by performing a cyclic shift on an identity matrix for 1 time. The rest can be deduced by analogy. Details are not described herein.

Figures 1, 4, 5:
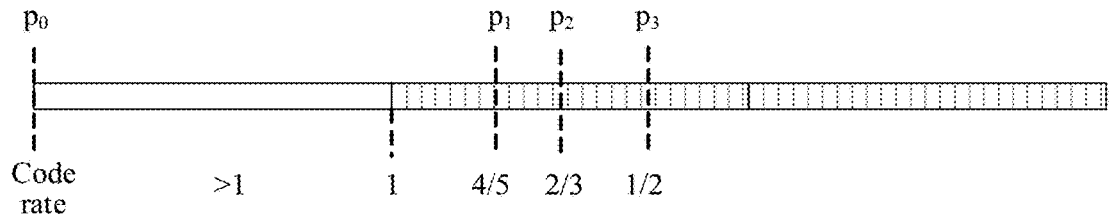
Figures 2, 5:
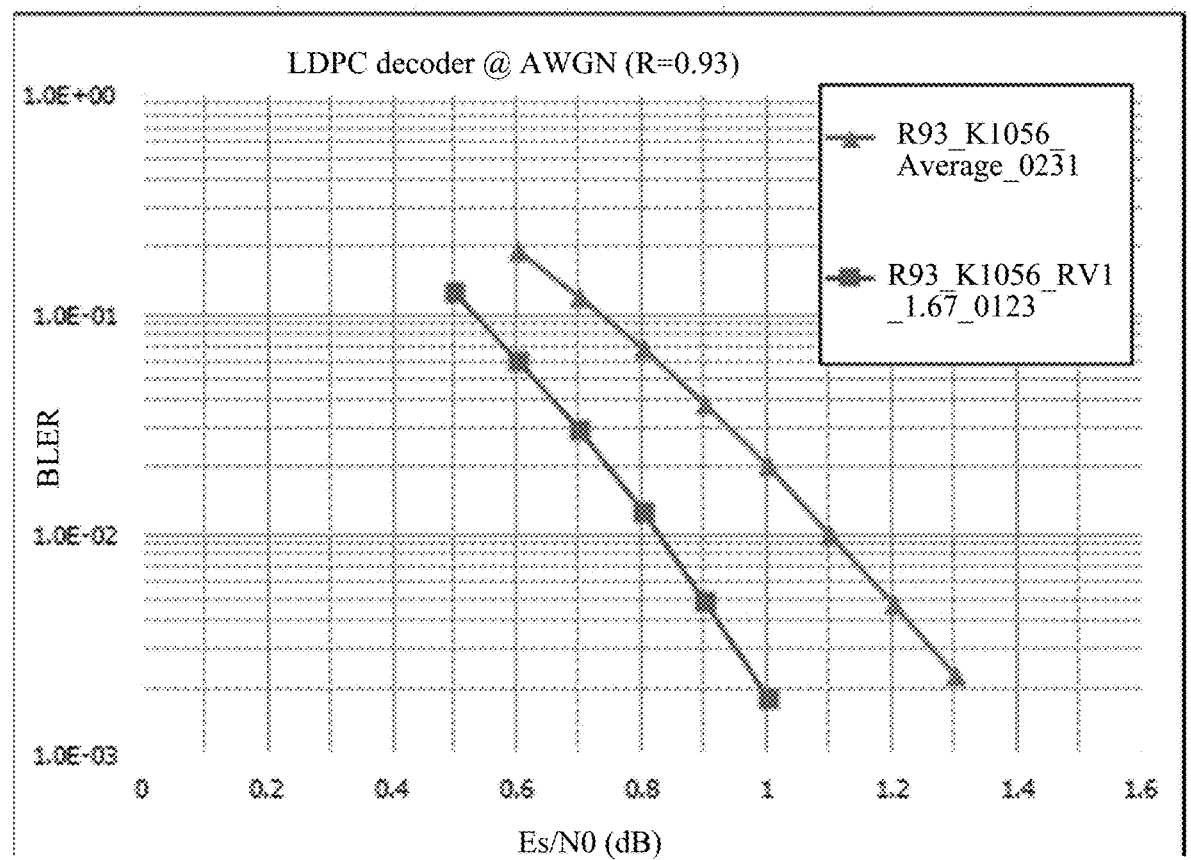
Figures 3, 5:
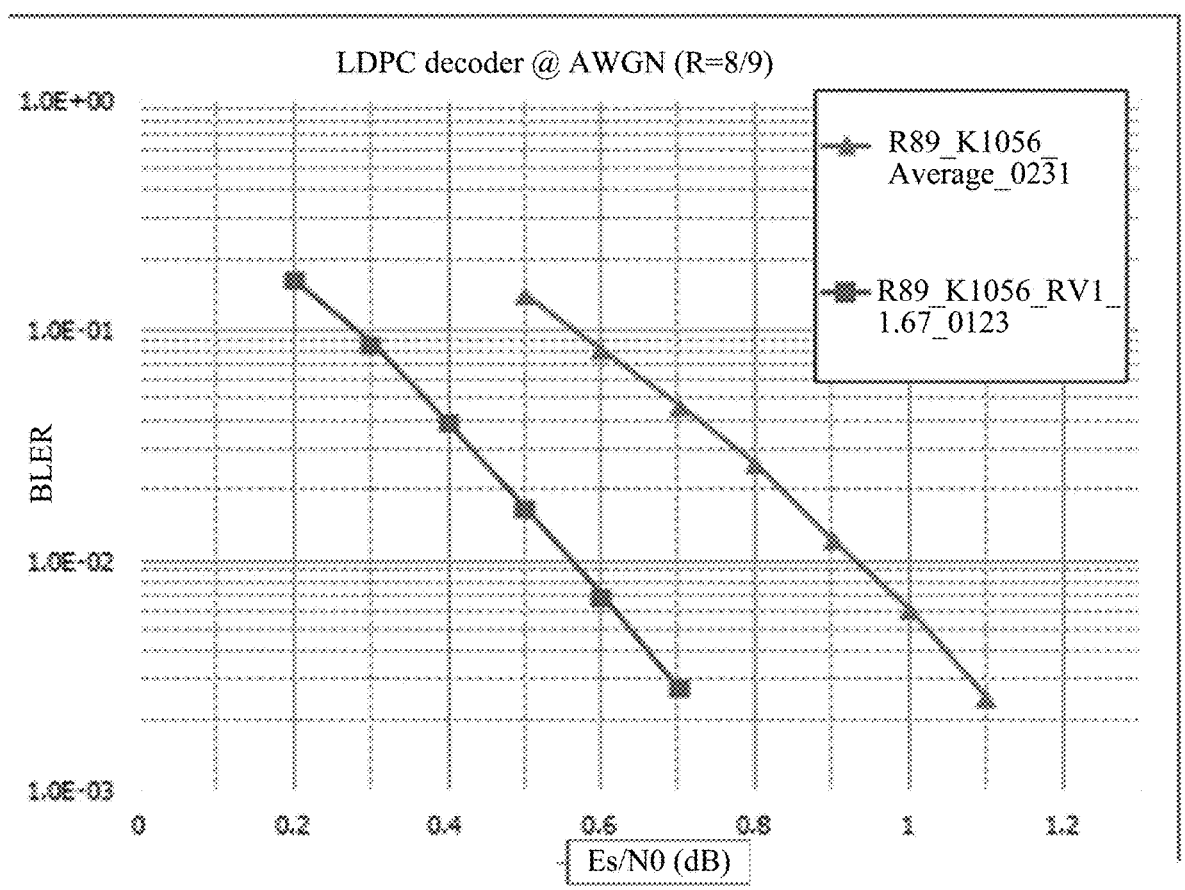
Figures 4, 5:
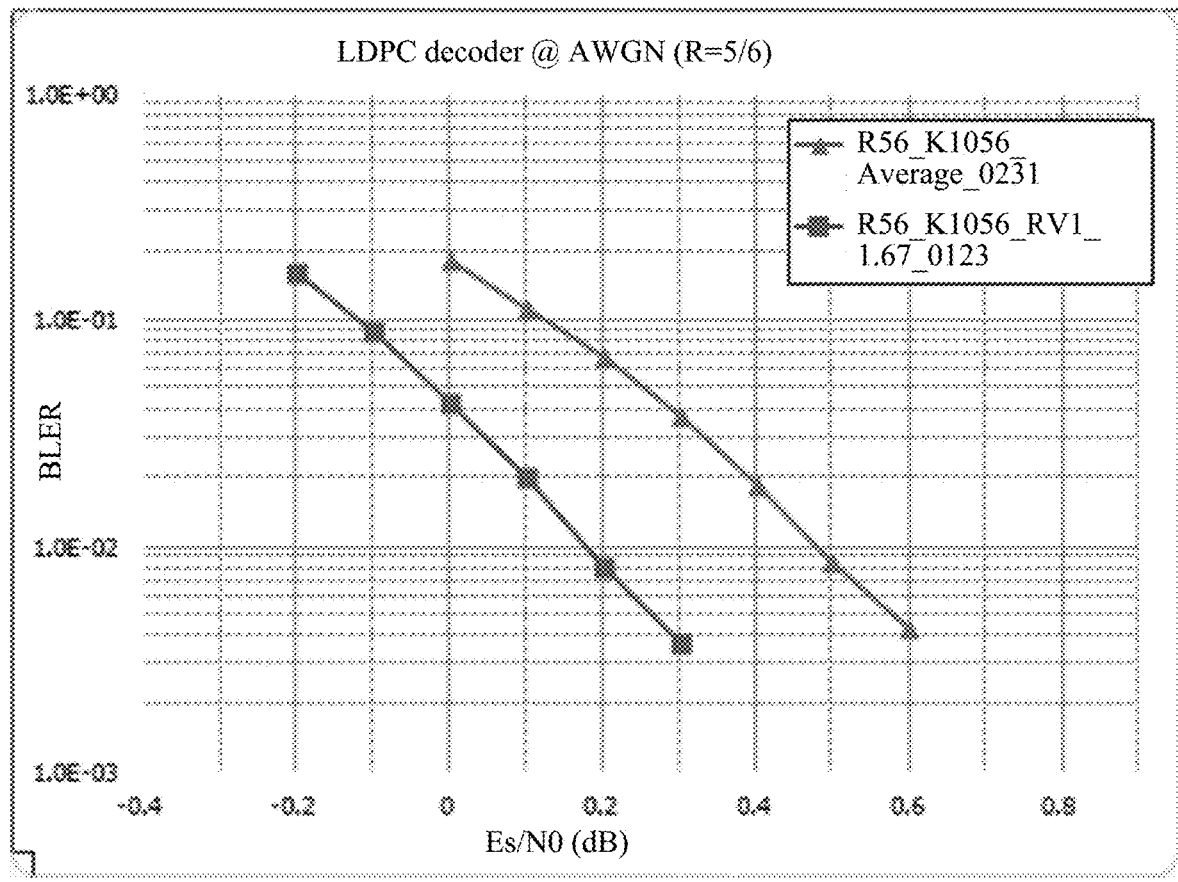

It may be understood that a base graph or a base matrix provided in the embodiments of the present invention is used as an example. For example, a base matrix shown in FIG. 1 or a base graph shown in FIG. 5-1 is used as an example for description; however the present invention is not limited thereto.

In the communications system, information data is transmitted between communications devices (for example, a base station or a terminal). A wireless transmission environment is complex and variable, and is easily interfered with, and an error easily occurs. To reliably send information data, a communications device on a transmit end performs processing such as CRC check, channel coding, rate matching, and interleaving on the information data, maps interleaved coded bits into modulated symbols, and sends the modulated symbols to a communications device on a receive end. After receiving the modulated symbols, the receiving device correspondingly performs demodulating, de-interleaving, rate de-matching, decoding, and CRC check to convert the modulated symbols into the information data. In these processes, transmission errors can be reduced and data transmission reliability can be enhanced.

A communications system 200 shown in FIG. 2 may be widely applied to different types of communication such as voice communication and data communication. The communications system may include a plurality of wireless communications devices. For clarity, FIG. 2 shows only a communications device 20 and a communications device 21. Control information or data information is received and sent between the communications device 20 and the communications device 21 as an information sequence. In a possible design, the communications device 20 serves as a communications device on a transmit end, sends an information sequence in form of transport blocks (TB), and performs CRC attachment to each transmission block. If a size of a transport block with CRC attachment exceeds a maximum code block length, the transport block needs to be segmented into several code blocks (CB). Code block CRC attachment may be performed on each code block, or code block group CRC attachment may be performed on each code block group, further filler bits may be inserted into each code block. The communications device 20 performs channel coding (e.g., LDPC coding) on each code block to obtain a corresponding coded block. Each coded block includes information bits and parity-check bits, and if the information bits include one or more filler bits, the filler bit is usually represented by "null" (Null).

A coded block or a coded block on which bit rearrangement is performed is stored in a circular buffer of the communications device 20, and the communications device 20 sequentially obtains a plurality of output bits from the coded block in the circular buffer, to obtain an output bit sequence. Output bit is a bit other than a filler bit in the coded block, and therefore the output bit sequence does not include any filler bit. The output bit sequence is sent after being interleaved and mapped into modulated symbols. In retransmission, the communications device 20 selects another output bit sequence from the coded block in the circular buffer for sending. If sequential obtaining of output bits reaches a last bit of the circular buffer, output bit selection continues from a first bit of the circular buffer.

After demodulating and de-interleaving received modulated symbols, the communications device 21 stores soft values of the received output bit sequence in a corresponding position in a soft information buffer (soft buffer). If retransmission occurs, the communications device 21 combines soft values of output bit sequences in all retransmissions and stores combined soft values in the soft information buffer. Combining herein means that if positions of output bits received in two transmissions are the same, soft values of the output bits received in the two transmissions are combined. A position of each soft value in the soft information buffer of the communications device 21 corresponds one-to-one to a position of each bit in the coded block in the circular buffer of the communications device 20. To be specific, if a position of an output bit in the coded block in the circular buffer of the communications device 20 is a $p^{th}$ bit, a position of a soft value of the output bit in the soft information buffer of the communications device 21 is also the $p^{th}$ bit.

The communications device 21 decodes all soft values in the soft information buffer to obtain a code block of an information sequence. Because the communications device 21 may obtain a transmission block size, the communications device 21 may determine a quantity of code blocks obtained after one transmission block is segmented and a length of each code block. If the code block includes CRC parity bit segment, the communications device 21 may further check the code block by using the CRC parity bit segment. The communications device 21 concatenated all code blocks into one transmission block, and further performs parity-check and concatenation on transmission blocks to finally obtain the information sequence. It may be learned that the communications device 21 performs a reverse process of an information processing method performed by the communications device 20.

It should be noted that a process of receiving and sending the information sequence between the communications device 20 and the communications device 21 is merely used as an example for description, and division of the modules is merely schematic. Some modules may be optional according to a requirement of a system design, and functions of some modules may be combined into one module for execution. This is not limited. In addition, the modules may be implemented by one or more processors. The present invention is not limited thereto.

In the embodiments of the present invention, "interleaving" means that positions of one or more bit segments in a bit sequence are changed, and each bit segment includes one or more bits.

It should be noted that in the embodiments of the present invention, the communications device 20 may be a network device in a communications system, for example, a base station, and correspondingly, the communications device 21 may be a terminal. Alternatively, the communications device 20 may be a terminal in a communications system, and correspondingly, the communications device 21 may be a network device in the communications system, for example, a base station. Alternatively, the communications device 20 and the communications device 21 may be chips, and each module in the foregoing processing process may be implemented by one or more processors.

Figure 3:
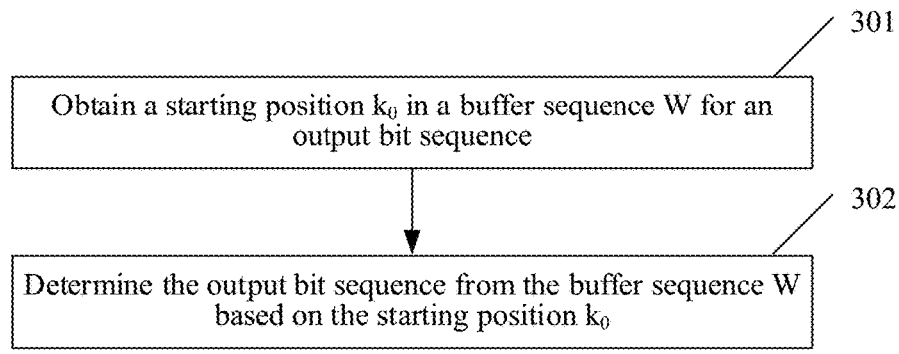
FIG. 3 is a flowchart of an information processing method according to an embodiment of the present invention.

FIG. 3 is a schematic flowchart of an information processing method according to an embodiment of the present invention. The method may be applied to a communications system, and the communications system includes a communications device 20 and a communications device 21. The method may be implemented by the communications device 20 and includes the following steps.

301: Obtain a starting position $k_0$ of an output bit sequence in a buffer sequence W.

The communications device 20 performs a LDPC coding on a bit sequence C with a length K. The bit sequence C may be a bit sequence of control information or data information that needs to be sent by the communications device 20, or is obtained by performing at least code block segmentation processing on the bit sequence of control information or data information. The bit sequence C with the length K may include one or more cyclic redundancy check bits and/or one or more filler bits.

The communications device 20 determines, based on the length K of the bit sequence C, an LDPC matrix used for coding. For example, the communications device 20 may determine a lifting factor z based on K, and then perform lifting on a base matrix according to a code rate based on z to obtain an LDPC matrix. A coded bit sequence (coded block) is obtained after the bit sequence C is encoded by using the LDPC matrix.

If shortening is not performed, a bit sequence D may be the coded bit sequence; or if a shortening operation is performed on the coded bit sequence, to be specific, the bit sequence is shortened by $s_0$ bits, for example, $s_0$ bits are deleted from the coded bit sequence, the bit sequence D may be a bit sequence that is obtained after the coded bit sequence is shortened by $s_0$ bits, where $s_0$ is a positive integer. For example, $s_0 = n \cdot r$, n is a positive integer, and r is a quantity of bits included in a unit bit segment of the buffer sequence W. The unit bit segment reflects a granularity for setting the starting position in the buffer sequence W. For example, the starting position may be set in the buffer sequence W based on an integral multiple of the lifting factor, that is, a quantity r of bits included in the unit bit segment is equal to z. For another example, before entering the buffer sequence W, the bit sequence D may be interleaved. If an interleaving matrix includes $C_{subblock}$ columns, the interleaving matrix includes $R_{subblock}$ rows. $R_{subblock}$ is a minimum integer satisfying $K_D \leq C_{subblock} \cdot R_{subblock}$, and the quantity r of bits included in the unit bit segment may be $R_{subblock}$. In other words, the starting position may be set based on an integral multiple of $R_{subblock}$.

A length of the bit sequence D is $K_D$. The bit sequence D may include a plurality of bits in the bit sequence C, and may further include one or more parity-check bits. The bits in the bit sequence C are sometimes referred to as information bits or systematic bits in the bit sequence D. In the embodiments of the present invention, the bit sequence D is sometimes also referred to as a coded block.

The communications device 20 determines the output bit sequence based on the bit sequence D or a part of the bit sequence D. The output bit sequence is sent after performing processes such as modulation, etc. When supporting retransmission, the communications device may determine, based on the bit sequence D or the part of the bit sequence D, an output bit sequence to be transmitted each time.

In a possible design, the communications device 20 may determine the output bit sequence based on the buffer sequence W. The buffer sequence W with a length $N_{CB}$ includes the bit sequence D or a part of the bit sequence D.

In a possible implementation, the buffer sequence W may include all bits of the bit sequence D. For example, the buffer sequence W may include the bit sequence D. For another example, the buffer sequence W may alternatively include a bit sequence D after at least being interleaved. For another example, the buffer sequence may include a bit sequence D after at least being padded. For still another example, the buffer sequence may include a bit sequence D after at least being interleaved and padded.

In another possible implementation, the buffer sequence W may include some bits of the bit sequence D. For example, the length of the bit sequence D exceeds a maximum length of the buffer sequence W, and therefore, the buffer sequence W can only include some bits of the bit sequence D. For another example, the buffer sequence W may include some bits of a bit sequence D on which at least interleaving processing is performed. For another example, the buffer sequence W may include some bits of a bit sequence D on which at least padding processing is performed. For still another example, the buffer sequence W may include some bits of a bit sequence D on which at least interleaving processing and padding processing are performed.

The buffer sequence W may alternatively be referred to as a circular buffer. During initial transmission or retransmission, the communications device 20 determines the output bit sequence for the initial transmission or the retransmission from the bit sequence stored in the circular buffer. For ease of description, an $i^{th}$ transmission represents initial transmission or retransmission. i=0 represents initial transmission, and i>0 represents retransmission. i is an integer. For example, i=1 represents a first retransmission, and i=2 represents a second retransmission. An upper limit of retransmission times depends on a maximum quantity of retransmission times in the system. An output bit sequence for each initial transmission or retransmission may be a redundancy version (rv) of the bit sequence D.

$k_0$ represents a starting position for an output bit sequence in the circular buffer, i.e., the starting position in the buffer sequence W for the output bit sequence. For the $i^{th}$ transmission, $k_0$ may also be referred to as a starting position of a redundancy version for the $i^{th}$ retransmission. To distinguish between different retransmissions, (i) may be added after a corresponding parameter, for example, the different retransmissions are represented by $k_0(i)$ or $rv(i)$.

A value of $k_0$ is $p_k$, $p_k$ is one element in $\{p_0, p_1, p_2, \ldots, p_{k_{max}-1}\}$, $0 \leq k < k_{max}$, $0 \leq p_k < N_{CB}$, $p_k$ is an integer, k is an integer, $k_{max}$ represents a maximum quantity of starting positions that can be selected from the buffer sequence W for the output bit sequence, and $k_{max}$ is an integer greater than or equal to 4.

302: Determine the output bit sequence from the buffer sequence W based on the starting position $k_0$.

The communications device 20 may determine the output bit sequence from the buffer sequence W based on the starting position $k_0$ obtained in step 301.

For example, the communications device 20 sequentially obtains E bits as the output bit sequence starting from bit $k_0$ of the buffer sequence.

For another example, after sending an output bit sequence for initial transmission, i.e., a $0^{th}$ transmission, the communications device 20 receives a negative acknowledgement (NACK) from the communications device 21, and the communications device 20 needs to determine an output bit sequence for a first retransmission, that is, a first redundancy version $rv(1)$. Therefore, the communications device 20 obtains the starting position $k_0(1)$ in the buffer sequence W for the output bit sequence, and determines the output bit sequence for the first retransmission based on a length $E(1)$ and the starting position $k_0(1)$ of the output bit sequence, that is, determines the redundancy version $rv(1)$. The communications device 20 sends the output bit sequence $rv(1)$ to the communications device 21. If the communications device 20 receives a NACK from the communications device 21, the communications device 20 needs to determine an output bit sequence for a second retransmission, that is, a second redundancy version $rv(2)$. The communications device 20 determines a starting position $k_0(2)$ of the second redundancy version $rv(2)$, and determines the output bit sequence for the second retransmission based on a length $E(2)$ and the starting position $k_0(2)$ of the output bit sequence, that is, determine the redundancy version $rv(2)$. The rest can be deduced by analogy. When a maximum quantity of retransmission times is reached or a retransmission timer expires, or the communications device 20 receives a positive acknowledgement (ACK) from the communications device 21, the communications device 20 may end retransmission. Certainly, the communications device 20 may perform retransmission for a plurality of times without considering a NACK or ACK from the communications device 21.

During decoding, the communications device 21 on a receive end needs to combine soft value bits received in the initial transmission with soft value bits of all received redundancy versions and perform decoding. For a coded block obtained by performing LDPC encoding, to improve decoding performance of the communications device on the receive end, a quantity of repeated bits or skipped bits of all the received redundancy versions needs to be reduced.

Generally, decoding performance of LDPC code may be affected by various factors. For example, a decoding segment needs to include information bits. For another example, parity-check bits other than information bits need to be selected in an order in which they are generated during encoding, to form a low bit-rate codeword. For another example, when retransmission occurs, a higher proportion of repeated bits to to-be-decoded bits leads to poorer decoding performance.

FIG. 4-1 shows an LDPC coded block that includes information bits and parity-check bits. It is assumed that before puncturing is performed, a base matrix of the LDPC coded block supports a maximum code rate of 8/9 and supports a minimum code rate of 1/3. Puncturing indicates that a coded bit corresponding to a punctured column is not sent, so that a code rate can usually be increased.

As shown in FIG. 4-2, there are four values $p_0$, $p_1$, $p_2$, and $p_3$ of the starting position. In initial transmission, an output bit sequence (i.e., a redundancy version 0) is obtained from the $0^{th}$ starting position $p_0$. In a first retransmission, an output bit sequence is obtained from the second starting position $p_2$, that is, a redundancy version 1. Therefore, the redundancy version 0 and the redundancy version 1 are not continuous, and a large quantity of skipped bits are not transmitted. After receiving the two redundancy versions, the communications device on the receive end combines the two redundancy versions and performs decoding. However, because redundant bits skipped in FIG. 4-2 are not transmitted to the communications device on the receive end, the redundant bits skipped cannot be selected prior to redundant bits in the redundancy version 1 to form a codeword for decoding. Consequently, decoding performance is severely lost.

As shown in FIG. 4-3, in initial transmission, an output bit sequence is obtained from the $0^{th}$ starting position $p^0$, that is, a redundancy version 0. In a first retransmission, an output bit sequence is obtained from the first starting position $p_1$, that is, a redundancy version 1. Although the redundancy version 0 and the redundancy version 1 are continuous, but if a code rate of the initial transmission is relatively low, there are a relatively large quantity of repeated bits, so that decoding performance is also lost.

In step 301, a value of $k_0$ may be $p_k$, $p_k$ is one element in $\{p_0, p_1, p_2, \ldots, p_{k_{max}-1}\}$. In other words, there are $k_{max}$ values for the starting positions. $k_{max}$ may be an integer greater than or equal to 4. For example, $k_{max}=2^n$, and n is an integer greater than or equal to 2. and A subscript k of $p_k$ may be a starting position number of a redundancy version $rv_{idx}$.

$\{p_0, p_1, p_2, \ldots, p_{k_{max}-1}\}$ may be defined in many manners. For example, the set may be a set that includes only elements $\{p_0, p_1, p_2, \ldots, p_{k_{max}-1}\}$, or may be a subset of another set. The elements in the set $\{p_0, p_1, p_2, \ldots, p_{k_{max}-1}\}$ may be arranged in a particular sequence, or may not be arranged in a particular sequence. This is not limited in this application.

In a possible implementation which is different from the manner shown in FIG. 4-2 or FIG. 4-3, as shown in FIG. 4-4, the $k_{max}$ values $\{p_0, p_1, p_2, \ldots, p_{k_{max}-1}\}$ may be set at uneven intervals. There are at least two or more different intervals between adjacent values in $\{p_0, p_1, p_2, \ldots, p_{k_{max}-1}\}$. It is assumed that values of the starting positions in $\{p_0, p_1, p_2, \ldots, p_{k_{max}-1}\}$ are arranged in ascending order of subscripts. In other words, $p_0$ is a minimum value, $p_{k_{max}-1}$ is a maximum value, and $p_0 < p_1 < p_2 < \ldots < p_{k_{max}-1}$. A interval S between adjacent values is an absolute value $|p_k - p_{k-1}|$ of a difference between two adjacent starting positions, and $0 < k < k_{max}$.

A minimum starting position is $p_0 = 0$ Or $p_0 = l_0 \cdot r$, and $l_0$ is a positive integer. For example, $l_0$ may be 2. If an output bit sequence is determined starting from $p_0$, 2r bits need to be skipped first. And if r=z, coded information bits corresponding to first two columns of the base matrix are skipped and the two columns may usually be columns of built-in puncture bits. If the buffer sequence W does not include the coded information bits corresponding to the first two columns of the base matrix, $p_0=0$. It should be noted that only an example is provided herein, and the present invention is not limited thereto.

When the starting positions are set at even intervals, the absolute values $|p_k-p_{k-1}|$ are the same. In other words, intervals between adjacent values in $\{p_0, p_1, p_2, \ldots, p_{k_{max}-1}\}$ are the same.

When the starting positions are set at uneven intervals, there are at least two or more different intervals between adjacent values in $\{p_0, p_1, p_2, \ldots, p_{k_{max}-1}\}$. For example, there is a starting position $p_k$ that makes $|p_k-p_{k-1}|>|p_{k+1}-p_k|$.

Taking $k_{max}=4$ as an example: in a possible design, if $N_{CB} \geq K_D$, $k>0$, and the bit sequence D is a bit sequence obtained after encoding, then $p_k \geq (p_0+K)$. In this design, the buffer sequence W includes all bits of the bit sequence D or bits other than coded bits corresponding to the columns of built-in puncture bits of the bit sequence D, it is required that a code rate of a codeword including bits between $p_1$ and $p_0$ is at least less than or equal to 1, and $p_0 < (p_0+K) \leq p_1 < p_2 < p_3$, so that an interval $|p_1-p_0|$ is greater than or equal to K.

In another possible design, if $N_{CB} \geq K_D$, $k>0$, and the bit sequence D is obtained by shortening, by $s_0$ bits, a bit sequence obtained after encoding, then $p_k \geq (p_0-s_0+K)$. In this design, the buffer sequence W includes all bits of the bit sequence D, the $s_0$ bits may be used as an offset of the starting position that is set in case shortening is not performed as aforementioned, and $p_0 < (p_0-s_0+K) \leq p_1 < p_2 < p_3$.

In the foregoing designs, if retransmission occurs, an appropriate starting position may be selected from $p_1$ and $p_2$ based on the code rate of the initial transmission. The output bit sequence is determined in this way, so that there are a relatively small quantity of repeated bits after the output bit sequence is received and combined by the receive end.

As shown in FIG. 4-4, FIG. 4-4 shows an example in which the starting positions of the LDPC coded block shown in FIG. 4-1 are set at uneven intervals. The LDPC coded block supports a minimum code rate of 1/3, to be specific, information bits account for 1/3 of a total length. $p_2$ is located near a position for a code rate of 2/3, that is, in the middle of a sequence. $p_3$ is located near a position for a code rate of 0.5. $p_1$ is located near a position for a code rate of 0.8. Taking K=1056 as an example, if a code rate is 1/3, then a maximum length of a coded block is 3168 bits, where $p_2=1584$, $p_3=2122$, $p_1=1320$, and $p_1=0$. It may be learned that $(p_1-p_0)>(p_2-p_1)$ and there are three intervals between adjacent values.

In another possible design, if $N_{CB}<K_D$ and $k>0$, and the buffer sequence W includes some bits of the bit sequence D, then each $p_k$ may be scaled in equal proportion relative to the corresponding starting position in the buffer sequence W in case that the buffer sequence W includes all bits in the bit sequence D.

If the bit sequence D is a bit sequence obtained after encoding, then $$p_k \geq \left(p_0 + \left\lceil K \cdot \frac{N_{CB}}{K_D} \right\rceil\right).$$

In other words, $$p_0 < \left(p_0 + \left\lceil K \cdot \frac{N_{CB}}{K_D} \right\rceil\right) \leq p_1 < p_2 < p_3$$

is satisfied and therefore the interval $|p_1-p_0|$ is greater than or equal to $$\left\lceil K \cdot \frac{N_{CB}}{K_D} \right\rceil.$$

If the bit sequence D is obtained by shortening, by $s_0$ bits, a bit sequence obtained after encoding, then $$p_k \geq \left(p_0 - s_0 + \left\lceil K \cdot \frac{N_{CB}}{K_D} \right\rceil\right),$$

so that the interval $|p_1-p_0|$ is greater than or equal to $$\left\lceil K \cdot \frac{N_{CB}}{K_D} \right\rceil.$$

It should be noted that rounding down may alternatively be performed on the interval $|p_1-p_0|$ herein, that is, $$\left\lfloor K \cdot \frac{N_{CB}}{K_D} \right\rfloor.$$

Further, for the foregoing designs, it may be that $(p_1-p_0)>(p_2-p_1)$ and there are at least two or more different intervals between adjacent values in $\{p_0, p_1, p_2, \ldots p_{k_{max}-1}\}$.

Based on the foregoing designs, when $k>0$, $p_k$ needs to be at a position of an integral multiple of a unit bit segment while satisfying the foregoing requirements, that is, $p_k=l_k \cdot r$, $l_k$ is a positive integer. For example, if $N_{CB} \geq K_D$ and $k>0$, $$p_k \geq \left(l_0 \cdot r + \left\lceil \frac{K}{r} \right\rceil \cdot r\right).$$

For another example, if $N_{CB}<K_D$ and $k>0$, $$p_k \geq \left(l_0 \cdot r + \left\lceil \frac{K}{r} \cdot \frac{N_{CB}}{K_D} \right\rceil \cdot r\right).$$

It should be noted that only an example is provided herein, and suitable transformation may be performed on the formulas. For example, rounding up is changed to rounding down, so that the position of $p_k$ is an integral multiple of the unit bit segment. This embodiment of the present invention is not limited thereto.

For the value $p_k$ in $\{p_0, p_1, p_2, \ldots, p_{k_{max}-1}\}$, $k_0$ in step 301 may be obtained in various manners.

In another possible implementation, a sequence of obtaining starting position in each transmission may be defined, or a sequence of the subscript k of $p_k$ in each transmission may be defined. Such a sequence may be indicated to the communications device on the receive end, or may be pre-stored in the communications devices on a transmit end and the receive end.

The subscript k of $p_k$ may be a starting position number of a redundancy version $rv_{idx}$, a starting position number of a redundancy version in an $i^{th}$ transmission may be represented by $rv_{idx}(i)$, and a starting position $k_0(i)$ may be determined based on a starting position number of a redundancy version $rv_{idx}(i \bmod k_{max})$.

A method for obtaining starting positions in a fixed sequence may be used. In an embodiment, an $rv_{idx}$ sequence may be defined, and a quantity of values in the $rv_{idx}$ sequence may be $k_{max}$ or may be a maximum quantity $R_{max}$ of retransmission times. For example, when $k_{max}=8$, the $rv_{idx}$ sequence is 0, 3, 6, 2, 5, 7, 4, 1. In this case, in initial transmission, an output bit sequence is determined starting from a $p_0{}^{th}$ bit. $k_0(1)$ in a first transmission is $p_3$, an output bit sequence is determined starting from a $p_3{}^{th}$ bit. $k_0(2)$ in a second transmission is $p_6$, an output bit sequence is determined starting from a $p_6{}^{th}$ bit. The rest can be deduced by analogy. In a $k_{max}{}^{th}$ transmission, an output bit sequence is determined starting from the $p_0{}^{th}$ bit again. That is, for an $i^{th}$ transmission, $k=rv_{idx}(i \bmod k_{max})$ and $k_0(i)=p_k$. For another example, $k_{max}=4$, the maximum quantity $R_{max}$ of retransmission times is 4, and a value set of $rv_{idx}$ sequence is $\{0, 2, 3, 1\}$, so that in the initial transmission, an output bit sequence is determined starting from the $p_0{}^{th}$ bit, and $k_0(1)$ in the first transmission is $p_2$, an output bit sequence is determined starting from the $p_3{}^{th}$ bit, and $k_0(2)$ in the second transmission is $p_3$. For the $i^{th}$ transmission, $k=rv_{idx}(i \bmod R_{max})$ and $k0(i)=p_k$.

Further, the $rv_{idx}$ sequence may be determined based on a value of the code rate of the initial transmission, or may be determined based on a length E of an output bit sequence in each transmission and the lifting factor z. In a non-adaptive retransmission scenario, lengths of an output bit sequence in initial transmission and retransmission are the same. For example, the $rv_{idx}$ sequence is determined based on $$\left\lceil \frac{E}{z} \right\rceil.$$

For another example, one or more thresholds may be set, and the $rv_{idx}$ sequence is determined based on a relationship between $$\left\lceil \frac{E}{z} \right\rceil$$

and the thresholds.

For example, $k_{max}=8$, and a 66*82 LDPC matrix is used, and a quantity of columns corresponding to information bits is 16. For a coded block, a correspondence between the $rv_{idx}$ sequence and the code rate of the initial transmission is shown in Table 1. For example, when $R_0 \geq 0.8$ the $rv_{idx}$ sequence is $\{0, 2, 4, 6\}$.

TABLE 1

| Code rate $R_0$ of initial transmission | $rv_{idx}$ sequence |
| --- | --- |
| $R_0 \geq 0.8$ | 0, 2, 4, 6 |
| $0.53 \leq R_0 < 0.8$ | 0, 3, 6, 2 |
| $R_0 < 0.53$ | 0, 4, 2, 6 |

For another example, $k_{max}=8$, and a 66*82 LDPC matrix is used, and a quantity of columns corresponding to information bits is 16. For a coded block, a correspondence between the $rv_{idx}$ sequence and, the length E of output bit sequence and lifting factor z is shown in Table 2. For example, when $$20 < \left\lceil \frac{E}{z} \right\rceil \leq 30$$

the $rv_{idx}$ sequence is $\{0, 3, 6, 2\}$.

TABLE 2

| Length E of output bit sequence and lifting factor z | $rv_{idx}$ sequence |
| --- | --- |
| $\left\lceil \frac{E}{z} \right\rceil \leq 20$ | 0, 2, 4, 6 |
| $20 < \left\lceil \frac{E}{z} \right\rceil \leq 30$ | 0, 3, 6, 2 |
| $\left\lceil \frac{E}{z} \right\rceil > 30$ | 0, 4, 2, 6 |

Such implementations as aforementioned for a sequence of obtaining starting position in each transmission is suitable for non-adaptive retransmission, and starting position information does not need to be indicated, each time before transmission, to the communications device on the receive end.

The starting position $k_0(i)$ in the coded block for the output bit sequence may alternatively be obtained based on $rv_{idx}$ indicated by the communications device on the transmit end. Such a manner is suitable for adaptive retransmission.

In another possible implementation, the starting position $k_0$ may be obtained based on a parameter $f(rv_{idx})$ of the starting position number of the redundancy version $rv_{idx}$. For example, $$k_0 = r \cdot \left\lceil \frac{N_{CB}}{k_{max} \cdot r} \cdot f(rv_{idx}) \right\rceil + p_0,$$

and if $p_0 = l_0 \cdot r$, $$k_0 = r \cdot \left\lceil \frac{N_{CB}}{k_{max} \cdot r} \cdot f(rv_{idx}) \right\rceil + l_0,$$

if $p_0 = 0$, $$k_0 = r \cdot \left\lceil \frac{N_{CB}}{k_{max} \cdot r} \cdot f(rv_{idx}) \right\rceil \cdot r$$

r may be the lifting factor z or $R_{subblock}$. Taking $k_{max}=4$ as an example, $r_{Vidx}=0, 1, 2, 3$, thus $f(0)=0$, $f(1)=1.67$, $f(2)=2$, and $f(3)=3$. It should be noted that rounding up may be performed on $$\frac{N_{CB}}{k_{max} \cdot r} \cdot f(rv_{idx})$$

herein, or rounding down may be performed on $$\frac{N_{CB}}{k_{max} \cdot r} \cdot f(rv_{idx}).$$

FIG. 5-1 is a base graph of LDPC code that has a size of 46 rows and 68 columns. For example, $p_0=0$, $$k_0 = r \cdot \left\lceil \frac{N_{CB}}{k_{max} \cdot r} \cdot f(rv_{idx}) \right\rceil, r = z,$$

and bits corresponding to two columns of built-in puncture bits are not stored in the circular buffer. In a possible implementation, taking $N_{CB}=66z$, and $k_{max}=4$, when $r_{Vidx}=0$, $f(0)=0$, and when $r_{Vidx}=1$, $f(1)=1.67$. It may be learned that starting positions are 0 and 28z. When $r_{Vidx}=2$, $f(2)=2$, and correspondingly, a starting position is 33z. When $r_{Vidx}=3$, $f(3)=3$, and correspondingly, a starting position is 50z. In this case, $\{p_0, p_1, p_2, p_3\}$ may be $\{0, 28z, 33z, 55z\}$. In another possible implementation, for $r_{Vidx}=1$, $f(1)$ may have another value. As shown in Table 3, Table 3 shows different possible values of $f(1)$ and values $p_1$ of a starting position $k_0$ corresponding to $f(1)$:

TABLE 3

| f (1) | p$_1$ |
|---|---|
| 1.85 | 31z |
| 1.80 | 30z |
| 1.75 | 29z |
| 1.67 | 28z |
| 1.60 | 27z |
| 1.55 | 26z |
| 1.50 | 25z |
| 1.42 | 24z |
| 1.35 | 23z |

In Table 3, the value of $p_1$ makes an interval between $p_1$ and $p_0$ to fall between 23z and 31z (including 23z and 31z). Because a quantity of columns corresponding to information bits in the base graph shown in FIG. 5-1 is 22, K is less than or equal to 22z after encoding, and $p_1$ satisfies $p_1 \geq (p_0+K)$.

In another possible implementation, for $r_{Vidx}=2$ and $r_{Vidx}=3$, starting position combinations of $p_2$ and $p_3$ shown in Table 4 may be defined:

TABLE 4

| p$_2$ | p$_3$ |
|---|---|
| 36z | 51z |
| 35z | 51z |
| 34z | 51z |
| 33z | 51z |
| 35z | 50z |
| 34z | 50z |
| 33z | 50z |
| 32z | 50z |
| 34z | 49z |
| 33z | 49z |
| 32z | 49z |
| 31z | 49z |
| 33z | 48z |
| 32z | 48z |
| 31z | 48z |
| 30z | 48z |

In the above case shown in Table 4, an interval between $p_2$ and $p_3$ falls between 15z and 18z (including 15z and 18z), and an interval between $p_2$ and $p_0$ and an interval between $p_3$ and $p_0$ also satisfy $p_k \geq (p_0+K)$.

Optionally, the starting positions $\{p_0, p_1, p_2, p_3\}$ may be defined based on $p_1$ in Table 3 and the combinations of $p_2$ and $p_3$ in Table 4. $p_0$ may be 0 or $p_0=l_0 \cdot z$, and $t_0$ is a positive integer. The combinations of starting positions also satisfy $(p_1-p_0)>(p_2-p_1)$.

For example, $\{p_0, p_1, p_2, p_3\}$ may be $\{0, 31z, 33z, 50z\}$ or $\{0, 23z, 36z, 51z\}$ or the like, and various starting position combinations may be obtained based on $p_1$ in Table 3 and the combinations of $p_2$ and $p_3$ in Table 4. It should be noted that only an example is provided herein, and the present invention is not limited thereto.

In another possible implementation, due to a limited circular buffer (limited buffer), for the base graph shown in FIG. 5-1, $N_{CB}<66z$, and in this scenario, the starting positions may be scaled in equal proportion relative to the starting positions in Table 3 or Table 4. For example, the starting positions may still be integral multiples of z after the starting positions are scaled in equal proportion, and $$k_0 = z \cdot \text{Operation}\left(\frac{R_{rv_{idx}}}{66z} \cdot N_{CB}\right).$$

For another example, the starting positions may be scaled in equal proportion, but the starting positions do not need to be integral multiples of z, and $$k_0 = \text{Operation}\left(\frac{R_{rv_{idx}}}{66} \cdot N_{CB}\right). R_{rv_{idx}}$$

may be $p_1$ in Table 3, or $p_2$ or $p_3$ in Table 4. Operation(•) is a rounding operation which may be rounding up, rounding down, rounding off, or another rounding method.

FIG. 5-2 to FIG. 5-4 are performance simulation curves of LDPC code encoding obtained based on the base graph shown in FIG. 5-1 according to the foregoing embodiments. On an AWGN channel, two different starting position setting methods are simulated, and BLER curves in the different starting position setting methods are tested in a first retransmission at three different code rates: 0.93, 8/9, and 5/6 of initial transmission. In the figure, a horizontal coordinate represents an ExN0 of a current channel signal-to-noise ratio, and a vertical coordinate represents a block error rate (BLER, block error rate). In the figure, more proximity of the entire curve to a left side indicates a lower block error rate and better performance of the solution in a same signal-to-noise ratio. Herein, it is assumed that bit segment lengths in retransmission and initial transmission are the same, LDPC encoding is performed on all codewords, and a minimum coding rate supported by an LDPC matrix is 1/3.

A triangle labelled curve shows that a method for setting starting positions at even intervals is used, and a block labelled curve shows that the method for setting starting positions at uneven intervals shown in this embodiment of the present invention is used. The parameters $f(rv_{idx})$ of the starting position number of the redundancy version $rv_{idx}$ are 0, 1.67, 2, and 3. After comparison, in all cases, the block labelled curve is located at a left side of the triangle labelled curve, and this indicates that the method for setting starting positions at uneven intervals in this embodiment of the present invention has better performance than the method for setting starting positions at even intervals.

Figure 8:
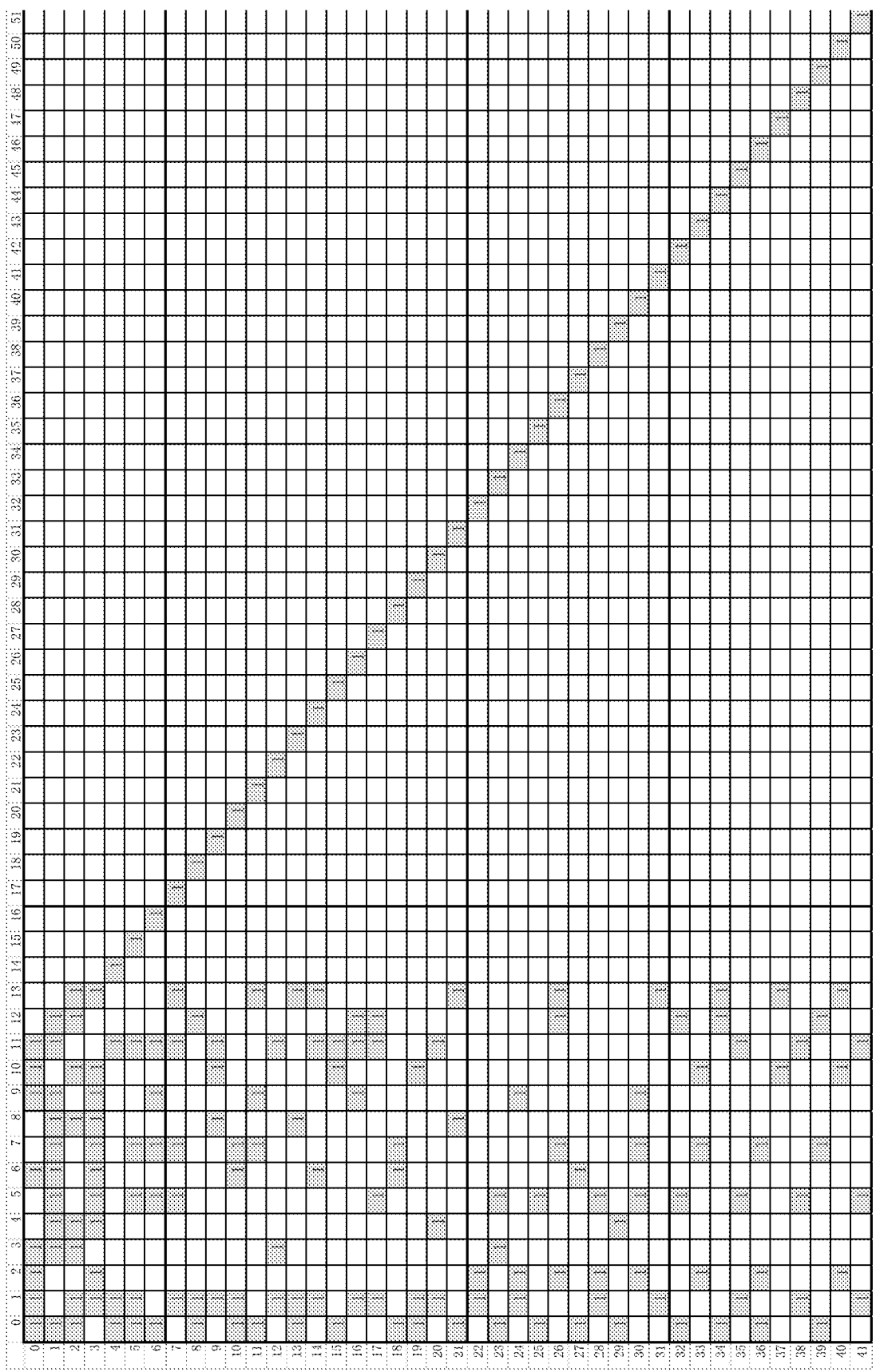
FIG. 8 is a base graph of LDPC code according to an embodiment of the present invention.

As shown in FIG. 8, FIG. 8 is a base graph of another LDPC code that has a size of 42 rows and 52 columns. A row index is marked in a leftmost column, and a column index is marked in an uppermost row. Only non-zero-elements are shown in each row and column and each non-zero-element is represented by "1", and each blank part is a zero-element. For example, $p_0=0$, $$k_0 = r \cdot \left\lceil \frac{N_{CB}}{k_{max} \cdot r} \cdot f(rv_{idx}) \right\rceil, r = z,$$

and bits corresponding to two columns of built-in puncture bits are not stored in the circular buffer. In a possible implementation, $N_{CB}=50z$, taking $k_{max}=4$, when $r_{Vidx}=0$, $f(0)=0$, and when $r_{Vidx}=1$, $f(1)=1.10$. It may be learned that starting positions are 0 and 14z. When $r_{Vidx}=2$, $f(2)=2$, and correspondingly, a starting position is 25z. When $r_{Vidx}=3$, $f(3)=3$, and correspondingly, a starting position is 38z. In this case, $\{p_0, p_1, p_2, p_3\}$ may be $\{0, 14z, 25z, 38z\}$. In another possible implementation, for $r_{Vidx}=1$, $f(1)$ may have another value. As shown in Table 5, Table 5 shows different possible values of $f(1)$ and values $p_1$ of a starting position $k_0$ corresponding to $f(1)$:

TABLE 5

| f (1) | $p_1$ |
|---|---|
| 1.10 | 14z |
| 1.15 | 15z |
| 1.25 | 16z |
| 1.32 | 17z |
| 1.40 | 18z |
| 1.48 | 19z |
| 1.56 | 20z |
| 1.64 | 21z |
| 1.72 | 22z |
| 1.80 | 23z |

In Table 5, the value of $p_1$ makes an interval between $p_1$ and $p_0$ to fall between 14z and 23z (including 14z and 23z). Because a quantity of columns corresponding to information bits in the base graph shown in FIG. 8 are 10, K is less than or equal to 10z after encoding, and $p_1$ satisfies $p_1 \geq (p_0+K)$.

In another possible implementation, for $r_{Vidx}=2$ and $r_{Vidx}=3$, starting position combinations of $p_2$ and $p_3$ shown in Table 6 may be defined:

TABLE 6

| $p_2$ | $p_3$ |
|---|---|
| 28z | 39z |
| 27z | 39z |
| 26z | 39z |
| 25z | 39z |
| 27z | 38z |
| 26z | 38z |
| 25z | 38z |
| 24z | 38z |
| 26z | 37z |
| 25z | 37z |
| 24z | 37z |
| 23z | 37z |
| 25z | 36z |
| 24z | 36z |
| 23z | 36z |
| 22z | 36z |

In this case, an interval between $p_2$ and $p_3$ falls between 11z and 14z (including 11z and 14z), and an interval between $p_2$ and $p_0$ and an interval between $p_3$ and $p_0$ also satisfy $p_k \geq (p_0+K)$.

Optionally, the starting positions $\{p_0, p_1, p_2, p_3\}$ may be defined based on $p_1$ in Table 5 and the combinations of $p_2$ and $p_3$ in Table 6. $p_0$ may be 0 or $p_0=l_0 \cdot z$, and $l_0$ is a positive integer. The combinations of staring positions also satisfy $(p_1-p_0) > (p_2-p_1)$.

For example, $\{p_0, p_1, p_2, p_3\}$ may be $\{0, 14z, 25z, 38z\}$ or $\{0, 18z, 28z, 39z\}$ or the like, and various starting position combinations may be obtained based on $p_1$ in Table 5 and the combinations of $p_2$ and $p_3$ in Table 6. It should be noted that only an example is provided herein, and the present invention is not limited thereto.

In another possible implementation, due to a limited circular buffer (limited buffer), for the base graph shown in FIG. 8, $N_{CB}<50z$, and in this scenario, the starting positions may be scaled in equal proportion relative to the starting positions in Table 5 or Table 6. For example, the starting positions may still be integral multiples of z after the starting positions are scaled in equal proportion, and $$k_0 = z \cdot \text{Operation}\left(\frac{R_{rv_{idx}}}{50z} \cdot N_{CB}\right).$$

For another example, the starting positions may be scaled in equal proportion, but the starting positions do not need to be integral multiples of z, and $$k_0 = \text{Operation}\left(\frac{R_{rv_{idx}}}{50z} \cdot N_{CB}\right) \cdot R_{rv_{ibx}}$$

may be $p_1$ in Table 5 or $p_2$ or $p_3$ in Table 6, Operation(•) is a rounding operation which may be rounding up, rounding down, rounding off, or other rounding methods.

In a possible implementation, the starting position in the coded block for the bit sequence may be obtained based on an interval between starting positions of two adjacent redundancy versions. $\{0, 28z, 33z, 50z\}$ described above is used as an example, the starting position may be determined based on an interval between starting positions of two adjacent redundancy versions described below: if $p_0=0$, the interval between starting positions of two adjacent redundancy versions is 0, 28z, 5z, 17z, 16z, then $k_0(1)=p_0+28z=28z$, $k_0(2)=k_0(1)+5z=33z$, and so on.

Optionally, after the information processing method is performed, the communications device may further process the output bit sequence, so that the output bit sequence is used during sending or receiving. For example, the communications device may interleave the output bit sequence, and map the interleaved output bit sequence into modulated symbols. For the processing, refer to a corresponding processing method in the prior art, and details are not described herein.

Figure 6:
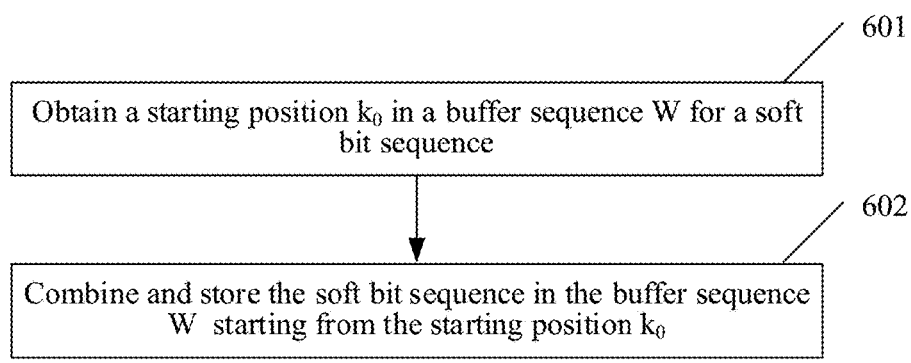
FIG. 6 is a flowchart of an information processing method according to an embodiment of the present invention.

FIG. 6 is a flowchart of an information processing method according to an embodiment of the present invention. The method may be applied to a communications system, and the communications system includes a communications device 20 and a communications device 21. The method may be implemented by the communications device 21 and includes the following steps.

601: Obtain a starting position $k_0$ in a buffer sequence W for a soft bit sequence.

602: Combine and store the soft bit sequence in the buffer sequence W starting from the starting position $k_0$.

The buffer sequence W includes a soft value sequence of a bit sequence D or a part of a soft value sequence of a bit sequence D, a length of the soft value sequence of the bit sequence D is $K_D$ bits, and the bit sequence D is a bit sequence that is obtained by encoding a bit sequence C with a length K based on a low-density parity-check LDPC matrix, or the bit sequence D is obtained by shortening, by $s_0$ bits, a bit sequence that is obtained by encoding a bit sequence C with a length K based on a low-density parity-check LDPC matrix.

A value of $k_0$ is $p_k$, $p_k$ is one element in $\{p_0, p_1, p_2, \ldots, p_{k_{max}-1}\}$, $0 \leq k < k_{max}$, $0 \leq p_k < N_{CB}$, $p_k$ is an integer, k is an integer, $N_{CB}$ is a length of the buffer sequence W, and $k_{max}$ is an integer greater than or equal to 4.

There are two or more different intervals between adjacent values in $\{p_0, p_1, p_2, \ldots, p_{k_{max}-1}\}$.

The communications device 20 sends the output bit sequence obtained in the foregoing embodiments to the communications device 21. It may be understood that the output bit sequence in the foregoing embodiments is an output bit sequence obtained after rate matching, and the communications device 20 may perform processing such as interleaving and modulation on the output bit sequence obtained after the rate matching, to send a sending signal corresponding to the output bit sequence. After receiving the output signal and performing demodulation and de-interleaving on the output signal, the communications device 21 obtains a soft bit sequence corresponding to the output bit sequence. In other words, one bit in the output bit sequence corresponds to one soft value bit (soft channel bit) in the soft bit sequence. positions of the soft value bits stored in the soft information buffer of the communications device 21 correspond one-to-one to positions of coded block in the circular buffer of the communications device 20. A size of the soft information buffer and a size of the coded block in the circular buffer are also the same and may be $N_{CB}$.

For example, an output bit sent by the communications device 20 is 1, and after channel transmission, the communications device 21 learns that a corresponding soft value bit of the output bit is 1.45, and if a position of the output bit in the coded block is a $5^{th}$ bit, a $5^{th}$ soft value bit in the soft information buffer of the communications device 21 is 1.45. It should be noted that only an example is provided herein for description, and this embodiment of the present invention is not limited thereto. If the output bit sequence obtained by the communications device 20 includes n output bits, the communications device 21 may obtain n corresponding soft value bits. If the communications device 21 receives soft value bits at a same position in two different transmissions, soft values of the soft value bits received in two different transmissions are combined. For example, if a soft value bit received in a first transmission is 1.45 and a soft value bit received in a second transmission is 0.5, 1.95 is obtained after combining 1.45 with 0.5. It should be noted that only an example is provided herein, and the present invention is not limited thereto.

It may be learned that the starting position $k_0$ and an obtaining manner thereof have corresponding features of those in the foregoing embodiments. For the features, refer to the descriptions of the foregoing embodiments, and details are not described herein again. It should be noted that for the communications device 20, the buffer sequence W is the coded block in the circular buffer, and for the communications device 21, the buffer sequence W is the soft value sequence in the soft information buffer. On a side of the communications device 20, the output bit sequence is determined from the coded block in the circular buffer, and on a side of the communications device 21, a received soft bit sequence is stored in the soft information buffer.

Figure 7:
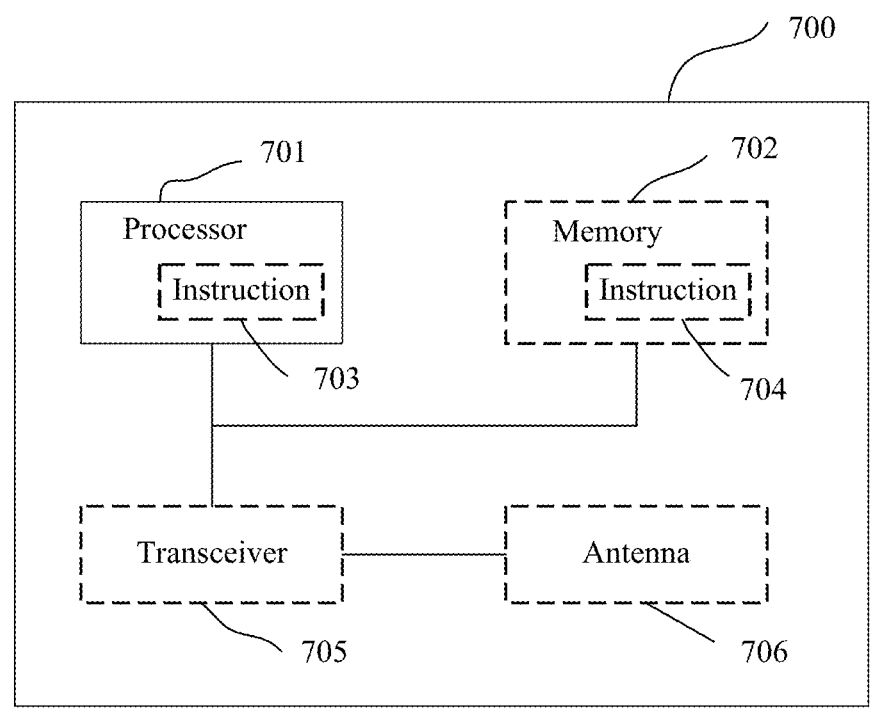
FIG. 7 is a structural diagram of an information processing apparatus according to an embodiment of the present invention.

FIG. 7 is a schematic structural diagram of a communications apparatus 700. The apparatus 700 may be configured to implement the methods described in the foregoing method embodiments. The communications apparatus 700 may be a chip, a base station, a terminal, or another network device. Alternatively, the communications apparatus 700 may be the communications device 20 or the communications device 21 in FIG. 2.

The communications apparatus 700 includes one or more processors 701. The processor 701 may be a general-purpose processor or a dedicated processor. For example, the processor 701 may be a baseband processor or a central processing unit. The baseband processor may be configured to perform processing on a communication protocol and communication data, and the central processing unit may be configured to control the communications apparatus (for example, the base station, the terminal, or the chip), to execute a software program and process data of the software program.

In a possible design, the communications apparatus 700 includes one or more processors 701, and the one or more processors 701 may implement the method in the embodiments shown in FIG. 3. Optionally, in addition to implementing the method in the embodiments shown in FIG. 3, the processor 701 may further implement other functions.

The communications apparatus 700 obtains a starting position $k_0$ in a buffer sequence W for an output bit sequence, where the buffer sequence W includes a bit sequence D or a part of a bit sequence D; and determines the output bit sequence from the buffer sequence W based on the starting position $k_0$.

In a possible design, the one or more processors 701 may implement the method in the embodiments shown in FIG. 6.

The communications apparatus 700 obtains a starting position $k_0$ in a buffer sequence W for a soft bit sequence, where the buffer sequence W includes a soft value sequence of a bit sequence D or a part of a soft value sequence of a bit sequence D, and a length of the soft value sequence of the bit sequence D is $K_D$; and combines the soft bit sequence with the buffer sequence W for storage starting from the starting position $k_0$.

In the foregoing possible design, the length of the bit sequence D is $K_D$ bits, and the bit sequence D is a bit sequence that is obtained by encoding a bit sequence C with a length K based on a low-density parity-check LDPC matrix, or the bit sequence D is obtained by shortening, by $s_0$ bits, a bit sequence that is obtained by encoding a bit sequence C with a length K based on a low-density parity-check LDPC matrix, where $s_0$ is an integer greater than 0.

A value of $k_0$ is $p_k$, $p_k$ is one element in $\{p_0, p_1, p_2, \ldots, p_{k_{max}-1}\}$, $0 \leq k < k_{max}$, $0 \leq p_k < N_{CB}$, $p_k$ is an integer, k is an integer, $N_{CB}$ is a length of the buffer sequence W, and $k_{max}$ is an integer greater than or equal to 4.

There are two or more different intervals of adjacent values in $\{p_0, p_1, p_2, \ldots, p_{k_{max}-1}\}$.

In an optional design, the processor 701 may also include an instruction 703, and the instruction may be run on the processor, so that the communications apparatus 700 performs the methods described in the foregoing method embodiments.

In another possible design, the communications apparatus 700 may further include a circuit, and the circuit may implement functions in the foregoing method embodiments.

Optionally, the communications apparatus 700 may include one or more memories 702 that store an instruction 704. The instruction may be run on the processor, so that the communications apparatus 700 performs the methods described in the foregoing method embodiments. Optionally, the memory may further store data. Optionally, the memory may store an instruction and/or data. The processor and the memory may be separately disposed or may be integrated together. Optionally, the one or more memories 702 may store a starting position, a parameter related to a redundancy version, or the like.

In another design, the one or more processors 701 may be configured to implement functions of modules shown in FIG. 2, for example, functions of modules in the communications device 20 or the communications device 21.

Optionally, the communications apparatus 700 may further include a transceiver 705 and an antenna 706. The processor 701 may be referred to as a processing unit and is configured to control the communications apparatus (the terminal or the base station). The transceiver 705 may be referred to as a transceiver unit, a transceiver, a transceiver circuit, or the like, and is configured to implement a receiving and sending function of the communications apparatus by using the antenna 706.

Optionally, the communications apparatus 700 may further include a component configured to generate a transmission block CRC, a component used for code block segmentation and CRC check, an encoder, an interleaver used for interleaving, a modulator used for modulation processing, and the like. Functions of the components may be implemented by using one or more processors 701.

Optionally, the communications apparatus 700 may further include a demodulator used for a demodulation operation, a de-interleaver used for de-interleaving, a decoder, or the like. Functions of the components may be implemented by using one or more processors 701.

Persons skilled in the art may further understand that various illustrative logical blocks and steps that are listed in the embodiments of the present invention may be implemented by using electronic hardware, computer software, or a combination thereof. Whether the functions are implemented by using hardware or software depends on particular applications and a design requirement of the entire system. Persons of ordinary skill in the art may use various methods to implement the described functions for each particular application, but it should not be considered that the implementation goes beyond the scope of the embodiments of the present invention.

The various illustrative logical units and circuits described in the embodiments of the present invention may implement or operate the described functions by using a general purpose processor, a digital signal processor, an application-specific integrated circuit (ASIC), a field programmable gate array (FPGA) or another programmable logical apparatus, a discrete gate or transistor logic, a discrete hardware component, or a design of any combination thereof. The general processor may be a microprocessor. Optionally, the general purpose processor may also be any conventional processor, controller, microcontroller, or state machine. The processor may also be implemented by a combination of computing apparatuses, such as a digital signal processor and a microprocessor, a plurality of microprocessors, one or more microprocessors with a digital signal processor core, or any other similar configuration.

Methods or algorithms described in the embodiments of the present invention may be directly embedded into hardware, an instruction executed by a processor, or a combination thereof. The memory may be a RAM memory, a flash memory, a ROM memory, an EPROM memory, an EEPROM memory, a register, a hard disk, a removable magnetic disk, a CD-ROM, or a storage medium of any other form in the art. For example, the memory may connect to a processor so that the processor may read information from the memory and write information to the memory. Alternatively, the memory may further be integrated into a processor. The processor and the memory may be arranged in an ASIC, and the ASIC may be arranged in UE. Optionally, the processor and the memory may be arranged in different parts of the UE.

Based on descriptions of the foregoing embodiments, persons skilled in the art may clearly understand that the present invention may be implemented by hardware, firmware or a combination thereof. When the present invention is implemented by using a software program, the present invention may be fully or partially implemented in a form of a computer program product, and the computer program product includes one or more computer instructions (also referred to as programs or codes). When the computer instructions are loaded and executed on the computer, the procedure or functions according to the embodiments of the present invention are all or partially generated. When the present invention is implemented by a software program, the foregoing functions may be stored in a computer-readable medium or transmitted as one or more instructions or code in the computer-readable medium. The computer may be a general-purpose computer, special-purpose computer, a computer network, or other programmable apparatuses. The computer instruction may be stored in a computer readable storage medium or transmitted from one computer readable storage medium to another computer readable storage medium. The computer-readable medium includes a computer storage medium and a communications medium, where the communications medium includes any medium that enables a computer program to be transmitted from one place to another. The storage medium may be any available medium accessible to a computer. The following provides an example but does not impose a limitation: The computer-readable medium may include a RAM, a ROM, an EEPROM, a CD-ROM, or another optical disc storage or disk storage medium, or another magnetic storage device, or any other medium that can carry or store expected program code in a form of an instruction or a data structure and can be accessed by a computer. In addition, any connection may be appropriately defined as a computer-readable medium. For example, if software is transmitted from a website, a server or another remote source by using a coaxial cable, an optical fiber/cable, a twisted pair, a digital subscriber line (DSL) or wireless technologies such as infrared ray, radio and microwave, the coaxial cable, optical fiber/cable, twisted pair, DSL or wireless technologies such as infrared ray, radio and microwave are included in fixation of a medium to which they belong. For example, a disk and disc used by the present invention includes a compact disc (CD), a laser disc, an optical disc, a digital versatile disc (DVD), a floppy disk and a Blu-ray disc, where the disk generally copies data by a magnetic means, and the disc copies data optically by a laser means. The foregoing combination should also be included in the protection scope of the computer-readable medium.

In summary, what is described above is merely example embodiments of the present invention, but is not intended to limit the protection scope of the present invention. Any modification, equivalent replacement, or improvement made without departing from the spirit and principle of the present invention shall fall within the protection scope of the present invention.

What is claimed is:

1. A method of rate matching for a low-density parity-check (LDPC) code in a communications system, the method which is applied to a communications apparatus comprising:

obtaining a starting position $k_0$ in a circular buffer with a length $N_{CB}$ for determining an output bit sequence, wherein the circular buffer comprises $N_{CB}$ bits of an encoded bit sequence D, wherein the encoded bit sequence D is obtained by encoding a bit sequence comprising K bits based on a LDPC matrix, the encoded bit sequence D comprises $K_D$ bits, $N_{CB} \leq K_D$ and $0 \leq K \leq K_D$, and wherein $k_0$ is any one value in $\{p_0, p_1, p_2, p_3\}$ and is less than $N_{CB}$, and $|p_1-p_0|$, $|p_2-p_1|$ and $|p_3-p_2|$ are different; and outputting the output bit sequence, wherein the output bit sequence comprises E bits starting from the starting position $k_0$ in the circular buffer, and each of the E bits is not a filler bit, wherein E is a length of the output bit sequence.

2. The method according to claim 1, wherein $p_0=0$.

3. The method according to claim 1, wherein $p_0<p_1<p_2<p_3$ and $(p_1-p_0)>(p_2-p_1)$.

4. The method according to claim 3, wherein $(p_3-p_2)>(p_2-p_1)$.

5. The method according to claim 3, wherein $N_{CB}=K_D$, and $p_1 \geq (p_0+K)$.

6. The method according to claim 3, wherein $N_{CB}<K_D$, and $$p_1 \geq \left(p_0 + \left\lfloor K \cdot \frac{N_{CB}}{K_D} \right\rfloor\right).$$

7. The method according to claim 1, wherein each of $p_1$, $p_2$ and $p_3$ is an integer multiple of z, z is a lifting factor of the LDPC matrix.

8. The method according to claim 1, wherein obtaining the starting position $k_0$ comprises:

obtaining the starting position $k_0$ based on either one of the following: (a) a starting position number of a redundancy version, or (b) a parameter of the starting position number of the redundancy version.

9. The method according to claim 8, wherein the starting position number of the redundancy version is obtained by using signaling or based on a sequence of starting position numbers of redundancy versions.

10. The method according to claim 9, wherein the sequence of starting position numbers of redundancy versions is read from a memory.

11. A communications apparatus comprising:
a processor; and
a non-transitory computer-readable storage medium coupled to the processor and storing programming instructions which, when executed by the processor, cause the processor to perform operations comprising:

obtaining a starting position $k_0$ in a circular buffer with a length $N_{CB}$ for determining an output bit sequence, wherein the circular buffer comprises $N_{CB}$ bits of an encoded bit sequence D, wherein the encoded bit sequence D is obtained by encoding a bit sequence comprising K bits based on a low-density parity-check (LDPC) matrix, the encoded bit sequence D comprises $K_D$ bits, $N_{CB} \leq K_D$ and $0 \leq K \leq K_D$, and wherein $k_0$ is any one value in $\{p_0, p_1, p_2, p_3\}$ and is less than $N_{CB}$, and $|p_1-p_0|$, $|p_2-p_1|$ and $|p_3-p_2|$ are different; and outputting the output bit sequence, wherein the output bit sequence comprising E bits starting from the starting position $k_0$ in the circular buffer, and each of the E bits is not a filler bit, wherein E is a length of the output bit sequence.

12. The communications apparatus according to claim 11, wherein $p_0=0$.

13. The communications apparatus according to claim 11, wherein $p_0<p_1<p_2<p_3$ and $(p_1-p_0)>(p_2-p_1)$.

14. The communications apparatus according to claim 13, wherein $(p_3-p_2)>(p_2-p_1)$.

15. The communications apparatus according to claim 13, wherein $N_{CB}=K_D$, and $p_1 \geq (p_0+K)$.

16. The communications apparatus according to claim 13, wherein $N_{CB}<K_D$, and $$p_1 \geq \left(p_0 + \left\lfloor K \cdot \frac{N_{CB}}{K_D} \right\rfloor\right).$$

17. The communications apparatus according to claim 11, wherein each of $p_1$, $p_2$ and $p_3$ is an integer multiple of z, and z is a lifting factor of the LDPC matrix.

18. The communications apparatus according to claim 11, wherein the operations further comprise:

obtaining the starting position $k_0$ based on either one of the following: (a) a starting position number of a redundancy version, or (b) a parameter of the starting position number of the redundancy version.

19. The communications apparatus according to claim 18, wherein the starting position number of the redundancy version is obtained by using signaling or based on a sequence of starting position numbers of redundancy versions.

20. The communications apparatus according to claim 19, wherein the sequence of starting position numbers of redundancy versions is read from a memory.

21. The communications apparatus according to claim 11, wherein the apparatus is a network device or a terminal device.

* * * * *